United States Patent
Pipitone et al.

(10) Patent No.: US 8,491,759 B2
(45) Date of Patent: Jul. 23, 2013

(54) RF IMPEDANCE MATCHING NETWORK WITH SECONDARY FREQUENCY AND SUB-HARMONIC VARIANT

(75) Inventors: John A. Pipitone, Livermore, CA (US); Gerald E. Boston, Glenwood Springs, CO (US)

(73) Assignee: COMET Technologies USA, Inc., San Jose, CA (US)

(*) Notice: Subject to any disclaimer, the term of this patent is extended or adjusted under 35 U.S.C. 154(b) by 247 days.

(21) Appl. No.: 12/908,745

(22) Filed: Oct. 20, 2010

(65) Prior Publication Data

US 2012/0097524 A1 Apr. 26, 2012

(51) Int. Cl.
*C23C 14/34* (2006.01)

(52) U.S. Cl.
USPC ............. 204/192.12; 204/298.08; 204/298.06

(58) Field of Classification Search
USPC ............... 204/192.12, 298.08, 298.06
See application file for complete search history.

(56) References Cited

U.S. PATENT DOCUMENTS 7,102,292 B2 * 9/2006 Parsons et al. ........... 315/111.21
2010/0012029 A1 * 1/2010 Forster et al. ................. 118/708

* cited by examiner

*Primary Examiner* — Rodney McDonald
(74) *Attorney, Agent, or Firm* — Edmonds & Nolte, PC

(57) ABSTRACT

Embodiments of the disclosure may provide a matching network for physical vapor deposition. The matching network may include a first RF generator coupled to a deposition chamber target through a first impedance matching network having a first tuning circuit. The first RF generator may be configured to introduce a first AC signal to the deposition chamber target. The matching network may also include a second RF generator coupled to a deposition chamber pedestal through a second impedance matching network. The second RF generator may be configured to introduce a second AC signal to the deposition chamber pedestal. The first tuning circuit may be configured to modify an effect of the second AC signal on plasma formed between the deposition chamber target and the deposition chamber pedestal.

20 Claims, 5 Drawing Sheets

RF IMPEDANCE MATCHING NETWORK WITH SECONDARY FREQUENCY AND SUB-HARMONIC VARIANT

BACKGROUND

In forming semiconductor devices, thin films are often deposited using physical vapor deposition ("PVD") or "sputtering" in a vacuum deposition chamber. Traditional PVD uses an atom of an inert gas, e.g. argon, ionized by an electric field and low pressure to bombard a target material. Released by the bombardment of the target with the inert gas, a neutral target atom travels to a semiconductor substrate and forms the thin film in conjunction with other atoms from the target. By ionizing the atoms released from the target as done in ionized PVD ("iPVD"), another type of sputtering, narrow vias may receive a thin film deposition by the ability to control the path of the ionized atoms released from the target by electric and magnetic fields, and therefore, where the atoms deposit on the semiconductor substrate.

In conventional PVD systems, however, fine control of the ionized atoms is limited. What is needed, therefore, is a system and method for fine control of the ion trajectory in a physical vapor deposition chamber.

SUMMARY

Embodiments of the disclosure may provide a matching network for physical vapor deposition. The matching network may include a first RF generator coupled to a deposition chamber target through a first impedance matching network having a first tuning circuit. The first RF generator may be configured to introduce a first AC signal to the deposition chamber target. The matching network may also include a second RF generator coupled to a deposition chamber pedestal through a second impedance matching network. The second RF generator may be configured to introduce a second AC signal to the deposition chamber pedestal. The first tuning circuit may be configured to modify an effect of the second AC signal on plasma formed between the deposition chamber target and the deposition chamber pedestal.

Embodiments of the disclosure may further provide a method for controlling physical vapor deposition. The method may include introducing a first AC signal to a target of a physical vapor deposition chamber through a first impedance matching network having a first tuning circuit and introducing a second AC signal to a pedestal disposed in the chamber through a second impedance matching network to bias the pedestal. The method may also include introducing a gas into the chamber to facilitate formation of a plasma between the target and the pedestal. The method may further include modifying an effect of a fundamental frequency of the second AC signal on the plasma with the first tuning circuit, thereby adjusting a plasma sheath to facilitate ionization trajectory control.

Embodiments of the disclosure may further provide a method for controlling physical vapor deposition. The method may include introducing a first AC signal to a target of a chamber of a physical vapor deposition system through a first impedance matching network having a tuning circuit and introducing a second AC signal to a pedestal disposed in the chamber to bias the pedestal. The method may also include introducing a gas into the chamber to facilitate formation of a plasma between the target and the pedestal. The method may further include modifying an effect of a fundamental frequency of the second AC signal on the plasma with the first tuning circuit, thereby adjusting a plasma sheath to facilitate ionization trajectory control, and auto-tuning the tuning circuit. Auto-tuning the tuning circuit may include determining a voltage magnitude and a current magnitude of the second AC signal, and modifying an impedance of a variable filter component of the tuning circuit to further adjust the plasma sheath based on the determined voltage magnitude and current magnitude.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
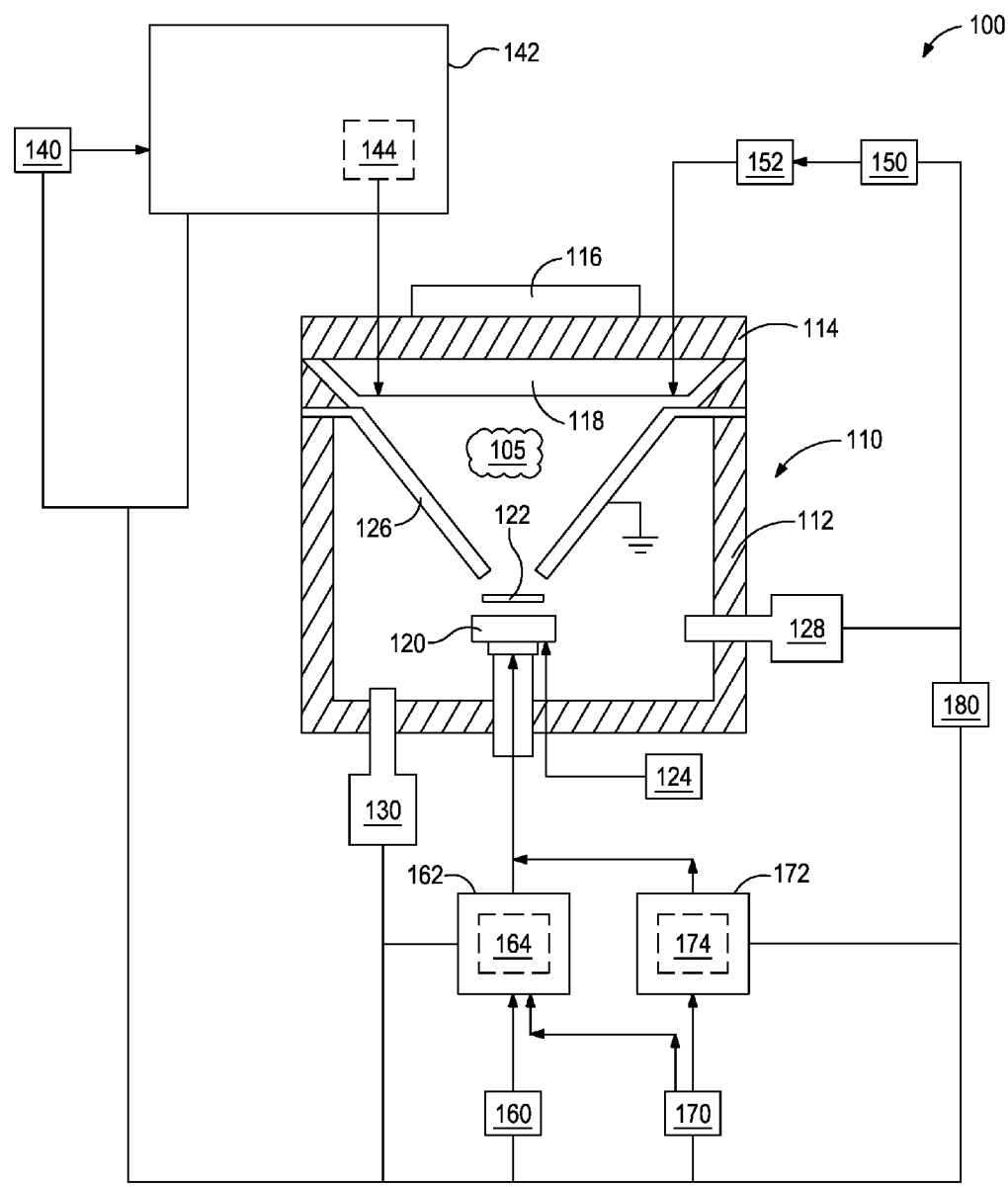
FIG. 1 is a schematic of an exemplary physical vapor deposition system, according to one or more embodiments of the disclosure.

It is to be understood that the following disclosure describes several exemplary embodiments for implementing different features, structures, or functions of the invention. Exemplary embodiments of components, arrangements, and configurations are described below to simplify the present disclosure; however, these exemplary embodiments are provided merely as examples and are not intended to limit the scope of the invention. Additionally, the present disclosure may repeat reference numerals and/or letters in the various exemplary embodiments and across the Figures provided herein. This repetition is for the purpose of simplicity and clarity and does not in itself dictate a relationship between the various exemplary embodiments and/or configurations discussed in the various Figures. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Finally, the exemplary embodiments presented below may be combined in any combination of ways, i.e., any element from one exemplary embodiment may be used in any other exemplary embodiment, without departing from the scope of the disclosure.

Additionally, certain terms are used throughout the following description and claims to refer to particular components. As one skilled in the art will appreciate, various entities may refer to the same component by different names, and as such, the naming convention for the elements described herein is not intended to limit the scope of the invention, unless otherwise specifically defined herein. Further, the naming convention used herein is not intended to distinguish between components that differ in name but not function. Additionally, in the following discussion and in the claims, the terms "including" and "comprising" are used in an open-ended fashion, and thus should be interpreted to mean "including, but not limited to." All numerical values in this disclosure may be exact or approximate values unless otherwise specifically stated. Accordingly, various embodiments of the disclosure may deviate from the numbers, values, and ranges disclosed herein without departing from the intended scope. Furthermore, as it is used in the claims or specification, the term "or" is intended to encompass both exclusive and inclusive cases, i.e., "A or B" is intended to be synonymous with "at least one of A and B," unless otherwise expressly specified herein.

FIG. 1 is a schematic of an exemplary physical vapor deposition system 100 of the disclosure. The physical vapor deposition ("PVD") system 100 includes a chamber 110 having a chamber body 112 and a lid or ceiling 114. A magnet assembly 116 is at least partially disposed on a first or "upper" side of the lid 114. The magnet assembly 116 may be, but is not limited to, a fixed permanent magnet, a rotating permanent magnet, a magnetron, an electromagnet, or any combination thereof. In at least one embodiment, the magnet assembly 116 may include one or more permanent magnets disposed on a rotatable plate that is rotated by a motor between about 0.1 and about 10 revolutions per second. For example, the magnet assembly 116 may rotate counter-clockwise at about 1 revolution per second.

A target 118 is at least partially disposed on a second or "lower" side of the lid 114 generally opposite the magnet assembly 116. The target 118 may be at least partially composed of, but is not limited to, single elements, borides, carbides, fluorides, oxides, silicides, selenides, sulfides, tellerudes, precious metals, alloys, intermetallics, or the like. For example, the target 118 may be composed of copper (Cu), silicon (Si), titanium (Ti), tantalum (Ta), tungsten (W), aluminum (Al), or any combination thereof.

A pedestal 120 may be disposed in the chamber 110 and configured to support a wafer or substrate 122. In at least one embodiment, the pedestal 120 may be or include a chuck configured to hold the substrate 122 to the pedestal 120. For example, the pedestal 120 may include a mechanical chuck, a vacuum chuck, an electrostatic chuck ("e-chuck"), or any combination thereof, for holding the substrate 122 to the pedestal 120. Mechanical chucks may include one or more clamps to secure the substrate to the pedestal 120. Vacuum chucks may include a vacuum aperture (not shown) coupled to a vacuum source (not shown) to hold the substrate 122 to the pedestal 120. E-chucks rely on the electrostatic pressure generated by an electrode energized by a DC voltage source to secure the substrate 122 to the chuck. In at least one embodiment, the pedestal 122 may be or include an e-chuck powered by a DC power supply 124.

A shield 126 may at least partially surround the pedestal 120 and the substrate 122 to intersect any direct path between the target 118 and the chamber body 112. The shield 126 may be generally cylindrical or frusto-conical, as shown. The shield 126 is generally electrically grounded, for example, by physical attachment to the chamber body 112. Sputter particles travelling from the target 118 toward the chamber body 112 may be intercepted by the shield 126 and deposit thereon. The shield 126 may eventually build up a layer of the sputtered material and require cleaning to maintain acceptable chamber particle counts. The use of the shield 126 may reduce the expense of reconditioning the chamber 110 to reduce particle count.

A gas supply 128 may be coupled to the chamber 110 and configured to introduce a controlled flow of selected gases into the chamber 110. Gas introduced to the chamber 110 may include, but is not limited to, argon (Ar), nitrogen ($N_2$), helium (He), xenon (Xe), hydrogen ($H_2$), or any combination thereof.

A vacuum pump 130 may be coupled to the chamber 110 and configured maintain a desired sub-atmospheric pressure or vacuum level in the chamber 110. In at least one embodiment, the vacuum pump 130 may maintain a pressure of between about 1 and about 100 millitorrs in the chamber 110. Both the gas supply 128 and the vacuum pump 130 are at least partially disposed through the chamber body 112.

A first RF generator 140 is generally coupled to the target 118 through the lid 114 of the chamber 110 through a first impedance matching network 142. The first RF generator 140 is configured to introduce a first RF signal through the lid 114 to the target 118. The first RF generator 140 may have a frequency ranging from 300 hertz ("Hz") to 162 megahertz ("MHz").

In at least one embodiment, a DC generator 150 may supply a DC signal to the chamber 110. For example, the DC generator 150 may supply a DC signal to the target 118. A DC filter 152 may be coupled to the DC generator 150 and configured to prevent RF signals, e.g. from the RF generator 140, from reaching and damaging the DC generator 150. Although not shown, the DC filter 152 may be disposed in the same enclosure as the first impedance matching network 142. The DC generator 150 is generally configured to increase ionic bombardment of the target 122.

A second RF generator 160 is coupled to the pedestal 120 through a second impedance matching network 162. The second RF generator 160 is configured to introduce a second RF signal to the pedestal 120 to bias the pedestal 120 and/or the chamber 110. The second impedance matching network 162 may be the same as the first impedance matching network 142, or it may be different, as desired. The second RF generator 160 may have a frequency ranging from 300 Hz to 162 MHz.

In at least one embodiment, a third RF generator 170 may also be coupled to the pedestal 120 through a third impedance matching network 172 or through the second impedance matching network 162 to further control the bias to the chamber 110. The third impedance matching network 172 may be the same as the first and/or second impedance matching networks 142, 162, or it may be different, as desired. Although not shown, on or more additional RF generators and corresponding impedance matching networks may be combined or used with the second and third RF generators 160, 170 and the second and/or third impedance matching networks 162, 172.

The first impedance matching network 142 may include a first tuning circuit 144 configured to target a fundament frequency of an RF bias signal produced by the second RF generator 160, the third RF generator 170, or any combination thereof. The first tuning circuit 144 may also be configured target the fundamental frequency's second and/or third harmonics, a combination of the second and third harmonics, or a combination of all three frequencies. The first tuning circuit 144 may target more than one fundamental frequency, corresponding harmonics, or any combination thereof, if the system 100 includes two or more biasing RF generators each having corresponding impedance matching networks, e.g. having the second and third impedance matching networks 162, 172 for the second and third generators 160, 170.

The second impedance matching network 162 may include a second tuning circuit 164 configured to target the fundamental frequency, second harmonic, and/or third harmonic of the first RF signal introduced to the lid 114 and/or the target 118 from the first RF generator 140.

In at least one embodiment, the third impedance matching network 172 may include a third tuning circuit 174 configured to target the fundamental frequency, second harmonic, and/or third harmonic of the first RF signal introduced to the lid 114 and/or the target 118 from the first RF generator 120.

The tuning circuits 144, 164, 174 may have several different configurations. For example, the tuning circuits 144, 164, 174 may be a fixed circuit, a manually tunable circuit, a circuit controlled by a system controller 180, an auto-tuning circuit, or any combination thereof. With a fixed circuit, the tuning circuits 144, 164, 174 may include fixed, i.e. non-adjustable, circuit elements. With a manually tunable circuit, the tuning circuits 144, 164, 174 may include adjustable or variable circuit elements (e.g. variable reactive elements). For example a manually tunable circuit may include one or more variable capacitors that may be manually adjusted with a screw or knob. If the tuning circuits 144, 164, 174 are controlled by the system controller 180, circuit elements of the tuning circuits 144, 164, 174 may be adjusted with stepper motors (not shown) based on control signals from the system controller 180. With an auto-tuning circuit, circuit elements of the tuning circuits 144, 164, 174 may again be adjusted by stepper motors via the system controller 180 based on information sensed from the chamber 110.

Current supplied to the chamber 110 via the first RF generator 140, the second RF generator 160, the third RF generator 170, the DC generator 150, or any combination thereof, cooperatively ionizes atoms in the inert gas supplied by the gas supply 128 to form a plasma 105 in the chamber 110. The plasma 105, for example, may be a high density plasma. The plasma 105 includes a plasma sheath, which is a layer in the plasma 105 which has a greater density of positive ions and, hence, an overall excess positive charge that balances an opposite negative charge on the surface of a material with which it is in contact.

The system controller 180 may be coupled to one or more gas supplies 128, the vacuum pump 130, the RF generators 140, 160, 170, and the DC generator 150. In at least one embodiment, the system controller 180 may also be coupled to one or more of the impedance matching networks 142, 162, 172. The system controller 180 may be configured to the control the various functions of each component to which it is coupled. For example, the system controller 180 may be configured to control the rate of gas introduced to the chamber 110 from the gas supply 128. The system controller 180 may be configured to adjust the pressure within the chamber 110 with the vacuum pump 130. The system controller 180 may be configured to adjust the output signals from the RF generators 140, 160, 170, and/or the DC generator 150. In at least one embodiment, the system controller 180 may be configured to adjust the impedances of the impedance matching networks 142, 162, 172.

Figure 2:
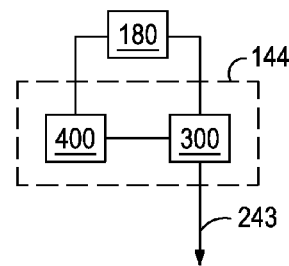
FIG. 2 is a schematic of an exemplary tuning circuit, according to one or more embodiments of the disclosure.

FIG. 2 is a schematic of an exemplary tuning circuit 144 of the disclosure. The tuning circuit 144 may be disposed in the impedance matching networks 142 and include a V/I probe 300 and a filter array 400. The filter array 400 may include, but is not limited to, one or more notch filters, one or more low pass filters, and/or one or more high pass filters. The filters in the filter array 400 may be adjustable, for example, by a stepper motor (not shown) to adjust variable capacitors (or other reactive elements) that compose part of the filters in the filter array 400. Although the first tuning circuit 144 is depicted, the second and third tuning circuits 164, 174 disposed in the second and third impedance matching networks 162, 172 may include similar V/I probes and filter arrays.

The V/I probe 300 is disposed at an output 243 of the first impedance matching network 142 and may determine voltage, current, and phase of the chamber 110. The V/I probe 300 may disposed in the same enclosure as the first impedance matching network 142 and/or may be coupled to the lid 114 and/or the target 118 of the chamber 110. The voltage, current, and phase information may be fed to a control board in the V/I probe 300 and/or to an external system controller 180 that is adapted to adjust one or more filters in the filter array 400. In at least one embodiment, the V/I probe 300 feeds the voltage, current, and phase information directly to the filter array 400. Based on the voltage, current, and/or phase information received the control board in the V/I probe 300 and/or the system controller 180 may make adjustments to the filter array 400.

In at least one embodiment, the V/I probe 300 provides feedback to the system controller 180. For example, the system controller 180 may adjust one or more filter parameters in the filter array 400 based on historical data or user instructions, e.g. a look-up table, and the V/I probe 300 may provide feedback for the system controller 180 to verify actual impedance of the tuning circuit 144 compared to impedance values set by the system controller 180. In another embodiment, the system controller 180 may actively control the filter array 400 in accordance with a predefined algorithm using inputs from the V/I probe 300.

Figure 3:
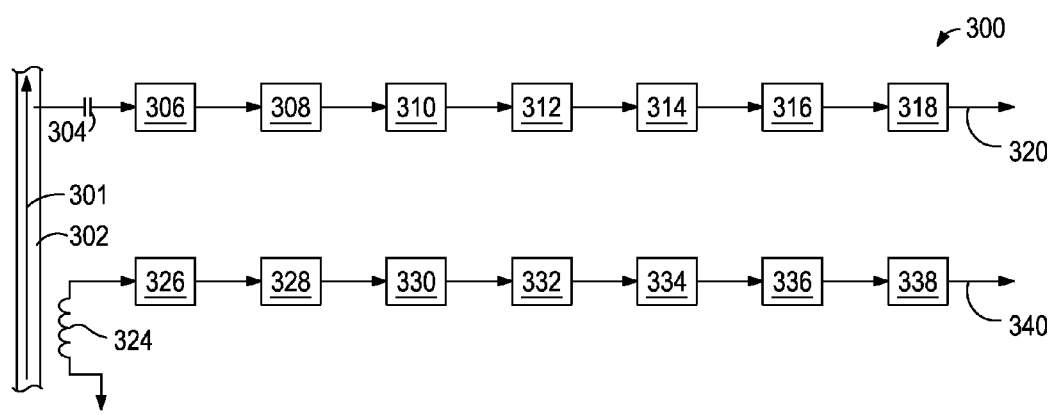
FIG. 3 is a schematic of an exemplary V/I probe, according to one or more embodiments of the disclosure.

FIG. 3 is a schematic of an exemplary V/I probe 300 of the disclosure. The V/I probe 300 may include an RF rod 302 disposed in or proximate the chamber 110 in FIG. 1 and configured to sense conditions of a signal 301 from the chamber 110. A voltage sensor, e.g. a capacitor 304, may be coupled to the RF rod 302 and configured to detect or "pickup" a voltage representative of the chamber signal 301 from the RF rod 302. A low pass filter 306 may be coupled to the capacitor 304 and configured to pass frequencies below a cutoff frequency and to attenuate frequencies above the cutoff frequency.

An attenuator 308 may be coupled to the low pass filter 306 and configured to reduce the amplitude and/or power of the signal received from the low pass filter 306 without appreciably distorting its waveform. An overshoot clamp 310 may be coupled to the attenuator 308 and configured to limit positive and/or negative transient voltage excursions and provide a clamped $RF_{RMS}$ voltage signal.

A converter 312 may be coupled to the overshoot clamp 310 and configured to convert the clamped $RF_{RMS}$ signal to DC form. In at least one embodiment, the converter 312 may be high frequency, low voltage, linear responding RMS to DC power converter. In at least one embodiment, the converter 312 may have wide bandwidth capabilities. For example, the converter 312 may operate at frequencies ranging from a low of about 400 kHz to a high of about 3 GHz. The converter 312 may be a discrete integrated circuit.

A DC voltage scaler 314 may be coupled to the converter 312 and configured to scale the voltage received from the converter 312. An offset adjustment 316 may be coupled to the DC voltage scaler 314 and configured to eliminate or adjust the offset of the scaled voltage signal. A voltage buffer amplifier 318 may be coupled to the offset adjustment 316 and configured output the magnitude of the measured voltage or "$V_{mag}$" signal 320 to a low-impedance load. In at least one embodiment, the voltage buffer amplifier 318 may have wide bandwidth capabilities. For example, the voltage buffer amplifier 318 may operate at frequencies ranging from a low of about 400 kHz to a high of about 3 GHz and may be a discrete integrated circuit.

A current sensor, e.g. an inductor 324, may also be coupled to the RF rod 302 and configured to detect or pick up a current representative of the chamber signal 301 from the RF rod 302 via the induced field in the inductor 324. A low pass filter 326 may be coupled to the inductor 324 and configured to pass frequencies below a cutoff frequency and to attenuate frequencies above the cutoff frequency.

An attenuator 328 may be coupled to the low pass filter 326 and configured to reduce the amplitude and/or power of the signal received from the low pass filter 326 without appreciably distorting its waveform. An overshoot clamp 330 may be coupled to the attenuator 328 and configured to limit positive and/or negative transient current excursions and provide a clamped $RF_{RMS}$ current signal.

A converter 332 may be coupled to the overshoot clamp 330 and configured to convert the clamped $RF_{RMS}$ current signal to DC form. In at least one embodiment, the converter 332 may be high frequency, low voltage, linear responding RMS to DC power converter. In at least one embodiment, the converter 332 may have wide bandwidth capabilities. For example, the converter 332 may operate at frequencies ranging from a low of about 400 kHz to a high of about 3 GHz and may be a discrete integrated circuit.

A DC current scaler 334 may be coupled to the converter 332 and configured to scale the current received from the converter 332. An offset adjustment 336 may be coupled to the DC current scaler 334 and configured to eliminate or adjust the offset of the scaled current signal. A current buffer amplifier 338 may be coupled to the offset adjustment 336 and configured output the magnitude of the measured current or "$I_{mag}$" signal 340 to a low-impedance load. In at least one embodiment, the voltage buffer amplifier 338 may have wide bandwidth capabilities. For example, the current buffer amplifier 338 may operate at frequencies ranging from a low of about 400 kHz to a high of about 3 GHz and may be a discrete integrated circuit.

In at least one embodiment, the low pass filter 326, attenuator 328, clamp 330, DC scaler 334, offset adjustment 316, and/or buffer amplification 338 may be the same as the low pass filter 306, attenuator 308, clamp 310, DC scaler 314, offset adjustment 316, and/or buffer amplification 318, or they may be different components, as desired.

Although not shown, the $V_{mag}$ signal 320 and/or the $I_{mag}$ signal 340 may be coupled to a phase detection circuit to determine the phase of the chamber signal 301 sensed by the rod 302. Phase detection is accomplished by a subtractive measurement, and/or gain measurement, of the $V_{mag}$ signal 320 and $I_{mag}$ signal 340. The subtractive or gain comparison happens in a logarithmic domain, resulting in an output that has as a linear ratio. The $V_{mag}$ signal 320, $I_{mag}$ signal 340, and/or the phase may be transmitted to the system controller 180 or a controller board (not shown) in the V/I probe 300.

Figure 4:
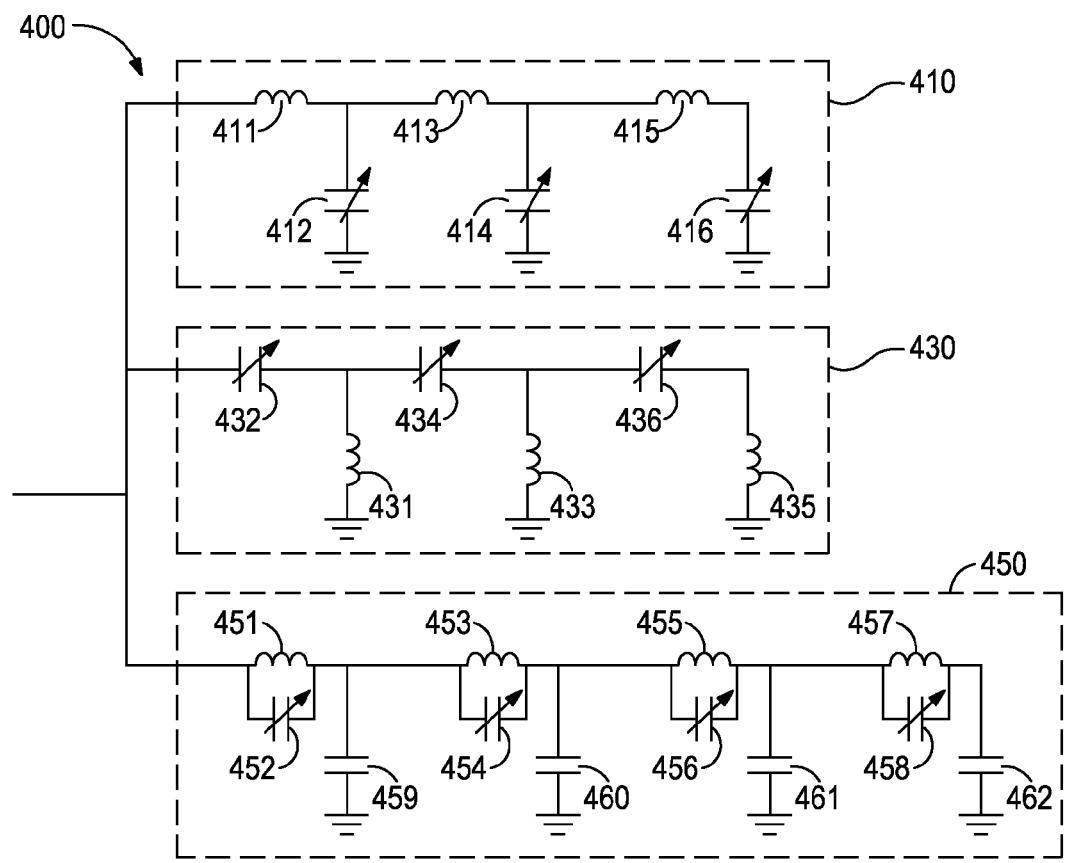
FIG. 4 is a schematic of an exemplary filter array disposed in the tuning circuit depicted in FIG. 2, according to one or more embodiments of the disclosure.

FIG. 4 is a schematic of an exemplary filter array 400 disposed in the tuning circuit 144 depicted in FIG. 2 of the disclosure. The filter array 400 may include one or more low pass filters 410, one or more high pass filters 430, and/or one or more notch filters or resonant traps 450. The low pass filter 410, the high pass filter 430, and the notch filter 450 may be in parallel or in series.

In at least one embodiment, the low pass filter 410 may be a passive, analog low pass filter including one or more inductors (three are shown 411, 413, 415) and one or more capacitors (three are shown 412, 414, 416), where the capacitors may be variable capacitors. For example, the low pass filter 410 may include three cascaded LC sections, where a first LC section includes a first inductor 411 in series with a first variable capacitor 412, a second LC section includes a second inductor 413 in series with a second variable capacitor 414, and a third LC section includes a third inductor 415 in series with a third variable capacitor 416.

In at least one embodiment, the high pass filter 430 may be a passive, analog high pass filter including one or more inductors (three are shown 431, 433, 435) and one or more capacitors (three are shown 432, 434, 436), where the capacitors may be variable capacitors. For example, the high pass filter 430 may include three cascaded LC sections, where a first LC section includes a first variable capacitor 432 in series with a first inductor 431, a second LC section includes a second variable capacitor 434 in series with a second inductor 433, and a third LC section includes a third variable capacitor 436 in series with a third inductor 435.

In at least one embodiment, the notch filter 450 may be a passive, analog filter including one or more inductors (four are shown 451, 453, 455, 457), one or more variable capacitors (four are shown 452, 454, 456, 458), and one or more fixed capacitors (four are shown 459, 460, 461, 462). The notch filter 450, the high pass filter 430, and/or the low pass filter 410 may include multiple sections targeted at multiple frequencies, as desired. For example, the notch filter 450 may include one or more sections individually targeted at the fundamental frequency of the second RF generator 160, the second harmonic of the second generator 160, the third harmonic of the second generator 160, and/or any combination thereof. The notch filter 450 may or may not include, as desired, one or more sections targeted at the fundamental frequency of the third generator 170, second harmonic of the third generator 170, the third harmonic of the third generator 170, and/or any combination thereof.

In at least one embodiment, the notch filter 450 includes four cascaded m-derived shunt half sections, where a first m-derived shunt half section is targeted at the fundamental frequency of the second generator 160 (see FIG. 1), a second m-derived shunt half section is targeted at the fundamental frequency's second harmonic, a third m-derived shunt half section is targeted at the fundamental frequency's third harmonic, and the fourth nn-derived shunt half section is targeted at a combination of the fundamental frequency and the second harmonic. For example, the first m-derived shunt half section includes a first inductor 451 in parallel with a first variable capacitor 452 to provide a first series impedance and first fixed capacitor 459 to provide a first shunt admittance. The second m-derived shunt half section of the cascade includes a second inductor 453 in parallel with a second variable capacitor 454 to provide a second series impedance and second fixed capacitor 460 to provide a second shunt admittance. The third m-derived shunt half section of the cascade includes a third inductor 455 in parallel with a third variable capacitor 456 to provide a third series impedance and third fixed capacitor 461 to provide a third shunt admittance. The fourth m-derived shunt half section includes a fourth inductor 457 in parallel with a fourth variable capacitor 458 to provide a fourth series impedance and fourth fixed capacitor 462 to provide a fourth shunt admittance.

These impedance tuned circuit elements of filter array 400 may be specifically configured to give a desired impedance value, e.g. r+/−jX value, at derivatives of the fundamental frequency of the second RF generator and/or the third RF generator, second order harmonics, third order harmonics, or any combination thereof, dependant on desired process performance requirements. The tuning circuit 144 has a resonant frequency, $F_{critical}$, but the tune point of the filtering notch of the filter array 400 is not necessarily at the specific secondary fundamental frequency or harmonic. The reactance may be set to a point on a Smith Chart that affects the secondary fundamental and an associated second or third harmonic −jX value, but the filtering notch does not necessarily have its minimum impedance at the secondary frequency or harmonic. For example, the filter array 400 may have a low Q that may affect the fundamental, second harmonic, and/or third harmonic if centered somewhere in between the two or three frequencies.

Figure 5:
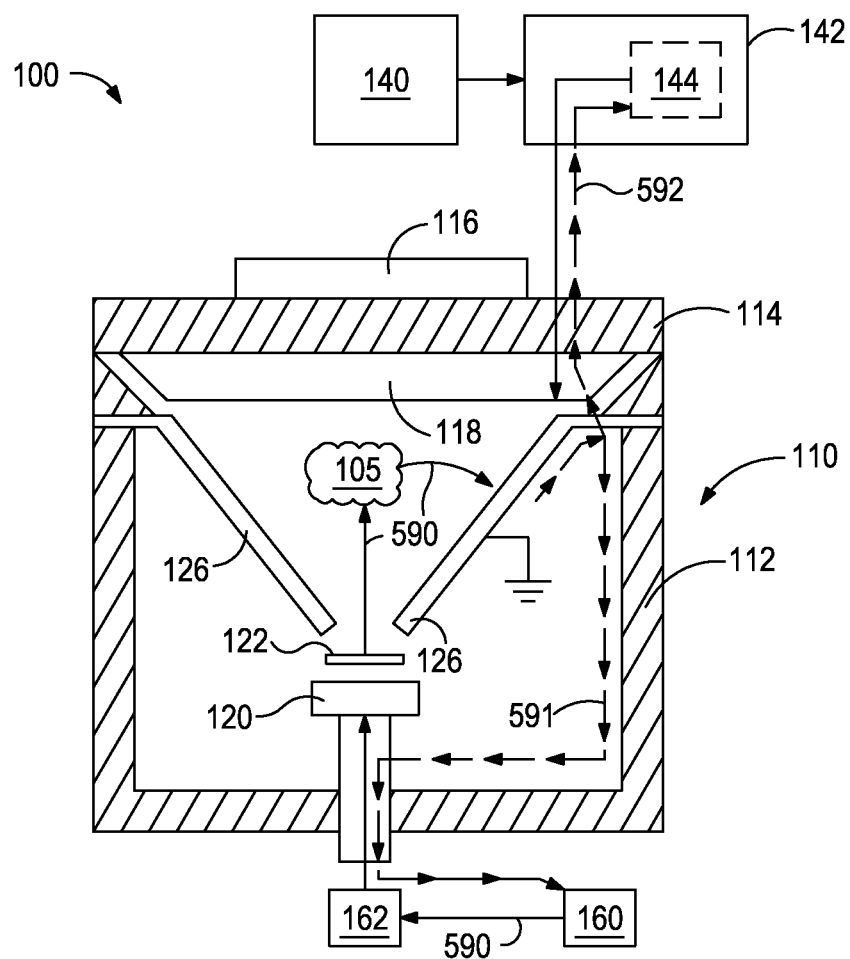
FIG. 5 is a schematic of an exemplary current path through the chamber and tuning circuit depicted in FIG. 1, according to one or more embodiments of the disclosure.

FIG. 5 is a schematic of an illustrative current path 590 through the chamber 110 and tuning circuit 144 depicted in FIG. 1, according to an exemplary embodiment. As discussed and described above with reference to FIG. 1, the first RF generator 140 is coupled through the first impedance matching network 142 to provide a current to the target 118, and the second RF generator 160 is coupled through the second impedance matching network 162 to provide a bias current to the pedestal 120.

Without the secondary tuning circuit 144 the current in the current path 590 begins at the second RF generator 160 and travels through the second impedance matching network 162, the pedestal 120, and the substrate 122 (which is chucked to the pedestal 120), to the plasma 105. The current in the current path 590 may be a low voltage RMS current. From the plasma 105, the current returns via current path 591 to the second RF generator 160 through the shield 126, the chamber body 112, and then back through the second impedance matching network 162.

With the secondary tuning circuit 144, at least a portion of the current in the current path 590 returns to the second RF generator 160 via a secondary current path 592 through the secondary tuning circuit 144. For example, at least a portion of the current in the current path 590 from the plasma 105 may travel to the shield 126 to form the second current path 592 through the target 118 and the lid 114 to the secondary tuning circuit 144 disposed in the first impedance matching network 142, and then continuing back through the chamber 110 to the second impedance matching network 162 and second RF generator 160.

Figure 6:
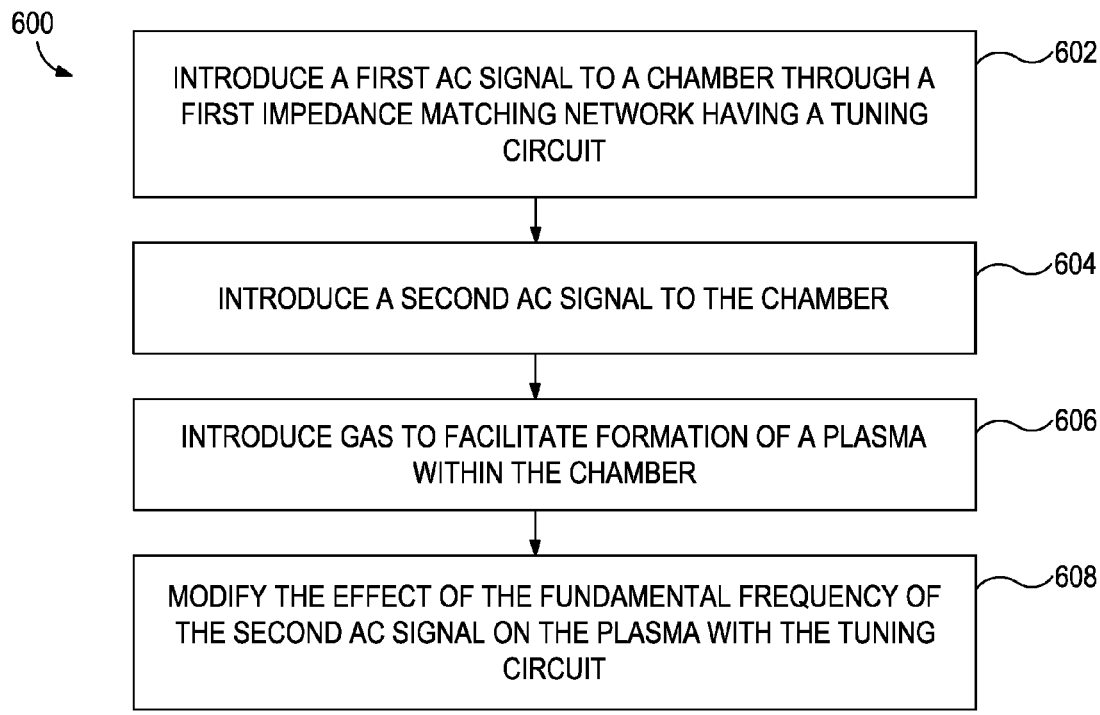
FIG. 6 illustrates a flowchart of an exemplary method for controlling automatic vapor deposition, according to one or more embodiments of the disclosure.

Referring to FIG. 6, with continuing reference to FIGS. 1-5, illustrated is a flowchart of an exemplary method 600 for controlling physical vapor deposition. In operation, power is applied to the target 118 by the first RF generator 140 and/or the DC generator 150. In at least one embodiment, a first AC signal is introduced from the first RF generator 140 through the lid 114 to the target 118 of the chamber 110 through the first impedance matching network 142, wherein the first impedance matching network includes the first tuning circuit 144, as at 602. A bias is applied to the pedestal 120 by the second RF generator 160 and/or the third RF generator 170. In at least one embodiment, a second AC signal is introduced to the pedestal 120 disposed through a second impedance matching network 162 to bias the pedestal 120, as at 604. The bias creates a voltage differential between the target 118 and the remainder of the chamber 110. In at least one embodiment, the power applied to the target 118 may be from about 5 kilowatts to about 60 kilowatts.

Gas, e.g. an inert gas, is introduced into the chamber 110 from the gas supply 128 to facilitate formation of the plasma 105 within the chamber 110, as at 606. Neutral atoms of the gas are ionized, giving off electrons. Due to the voltage differential between the target 118 and the chamber 110, the electrons impact other neutral atoms of the gas, creating more electrons and ionized atoms. This process is repeated so that the plasma 105, including electrons, ionized atoms, and neutral atoms, exists within the chamber 110.

The ionized atoms, which are positively charged, are attracted and therefore accelerated towards the target 118 that is negatively charged. The magnitude of the voltage differential in the chamber 110 controls the force and/or speed with which the atoms of the gas are attracted to the target 118. Upon impact with the target 118, the ionized gas's energy dislodges and ejects an atom from the target material. Some energy from the ionized gas may be transferred to the target 118 in the form of heat. The dislodged atoms becomes ionized like the neutral atoms, by impacting the electrons in the plasma 105. Once ionized, the released atoms follow magnetic field paths to the substrate 122 to form a sputtered layer with other identical, similar, or different atoms and/or materials already on the substrate 122. The magnetic field present in the chamber 110 may be at least partially controlled by the magnet 118 disposed on the lid 114 of the chamber 110.

The RF generators 140, 160, 170, if present, are coupled to the chamber 110 through the impedance matching networks 142, 162, 172, respectively. Each of the impedance matching networks 142, 162, 172 are adjusted so that the combined impedances of the chamber 110 and the respective impedance matching networks 142, 162, 172 match the impedance of the respective RF generators 140, 160, 170 to efficiently transmit RF energy from the RF generators 140, 160, 170 to the chamber 110 rather than being reflected back to the RF generators 140, 160, 170. For example, the first impedance matching network 142 may be adjusted so that the combined impedance of the chamber 110 and the impedance of the first matching network 142 match the impedance of the first RF generator 140 to prevent RF energy from being reflected back to the first RF generator 140.

In addition, the impedance matching networks 142, 162, 172 may each have tuning circuits 144, 164, 174. The tuning circuits 144, 164, 174 provide greater control of the ionization trajectory of the ionized metal in the plasma 105 sustained in the chamber 110 by reshaping of one or more plasma sheath parameters of the plasma 105.

Impedance in the tuning circuits 144, 164, 174 governs a current return path ratio between chamber body 112 and the target 118. The reshaping of the plasma sheath and the associated secondary RF fundamental current path affects the distribution of ion energy, and/or ion density, across the surface of the substrate 122. This redistribution of energy may allow for fine control of ion trajectory towards the surface of the substrate 122. In at least one embodiment, the effect of a fundamental frequency of the second AC signal from the second RF generator 160 on the plasma 105 may be modified with the tuning circuit 144, thereby adjusting plasma sheath parameters of the plasma 105 formed with in the chamber 110 to control ionization trajectory therein, as at 608. In another embodiment, the tuning circuit 144 may modify the effect of the fundamental frequency of the second AC signal, its second harmonic, its third harmonic, or a combination thereof, on the plasma 105 to further control the plasma sheath parameters of the plasma 105 and/or the ionization trajectory in the chamber 110. As such, the tuning circuit 144 may control ionization trajectory to reduce deposition overhang and improve bottom coverage for high aspect ratio structures on the substrate 122.

In at least one embodiment, one or more of the tuning circuits 164, 174 may also modify the effect of the fundamental frequency of a first AC signal from the first RF generator 140, its second harmonic, its third harmonic, or a combination thereof, on the plasma 105 to further control the plasma sheath parameters of the plasma 105 and/or the ionization trajectory in the chamber 110.

As discussed and described above, the tuning circuits 144, 164, 174 may be a fixed circuit, a manually tunable circuit, a circuit controlled by a system controller 180, an auto-tuning circuit, or any combination thereof. In the fixed circuit, the tuning circuits 144, 164, 174 may include fixed, i.e. non-adjustable, circuit elements, and the choice and values of those elements may be based on data gathered while running the chamber 110 normally. For example, the fixed circuit elements of the tuning circuit 144 may form one or more filters designed to target the fundamental frequency, second harmonic, third harmonic, and/or any combination thereof of the second RF generator 160 and/or the third RF generator 170 based on the data gathered prior to adding the first impedance matching network 142 in the system 100.

With a manually tunable circuit, the tuning circuits 144, 164, 174 may include adjustable or variable circuit elements. For example, a manually tunable circuit may include variable capacitors that may be manually adjusted with a screw or knob. In at least one embodiment, the variable capacitors may be part one or more filters and may be adjusted to change the characteristics of filter, e.g. the frequency range filtered. In at least one embodiment, the variable capacitors in the tuning circuits 144, 164, 174 may be manually adjusted at different stages and/or modes of the vapor disposition process carried out by the system 100. The adjustment in the manually tunable circuit may be based on theoretical data or data measured in the system 100.

In at least one embodiment, circuit elements of the tuning circuits 144, 164, 174 may be adjusted with one or more motors (not shown), e.g. stepper motors or the like, based on instructions from the system controller 180. For example, the circuit elements in one or more of the tuning circuits 144, 164, 174 may include variable capacitors. The system controller 180 may reference a look-up table containing specific capacitance values for each variable capacitor. The system controller 180 may adjust or modify the capacitance of the variable capacitors via the stepper motor based on the values in the look-up table. The look-up table may include capacitance values for different stages and/or modes in the vapor disposition process carried out by the system 100. The different values in the look-up table may be based on historical data or theoretical values. In at least one embodiment, the system controller 180 may adjust or modify the capacitance of the variable capacitors for each stage and/or mode.

With the auto-tuning circuit, circuit elements of the tuning circuits 144, 164, 174 may be adjusted based on information sensed from the chamber 110. Referring to FIG. 2, the tuning circuit 144 may include a V/I probe 300 to sense the voltage magnitude, the current magnitude, and/or the phase of the signal coming from the chamber 110.

The V/I probe 300 may also be used as feedback for the system controller 180. For example, when the system controller 180 has moved the adjusted variable capacitors based on the look-up table, the values sensed by the V/I probe 300 may be used as feedback to verify if the variable capacitors are properly adjusted and/or to instruct the system controller 180 to reference different values in the look-up table.

Referring once again to FIG. 3, in at least one embodiment, the capacitor 304 in the V/I probe 300 may pick up the voltage from the rod 302 disposed in the V/I probe 300. The voltage signal may be filtered and attenuated and the overshoot clamped to prevent harmonic distortion from the converter 312. The voltage signal may then be converted to a voltage signal in DC form by the converter 312. The DC voltage signal from converter 312 may be scaled, offset, and buffered to output the $V_{mag}$ signal 320 corresponding to the instant voltage magnitude in the chamber 110.

The inductor 324 in the V/I probe 300 may pick up the current from the rod 302. The current signal picked up by the inductor 324 may be filtered and attenuated and the overshoot clamped to prevent harmonic distortion from the converter 332. The current signal may then be converted to a current signal in DC form by the converter 332. The DC current signal from converter 332 may be scaled, offset, and buffered to output the $I_{mag}$ signal 340.

In at least one embodiment, the $V_{mag}$ signal 320 and/or the $I_{mag}$ signal 340 may be introduced to a phase detection circuit to determine the phase of input sensed by the rod 302. The $V_{mag}$ signal 320, the $I_{mag}$ signal 340, and/or the phase may be fed to a control board in the V/I probe 300 and/or to the system controller 180.

Based on the $V_{mag}$ signal 320, the $I_{mag}$ signal 340, and/or the phase, the control board in the V/I probe 300 and/or the system controller 180 may adjust the impedance of the RF tuning circuit 144. In at least one embodiment, the control board in the V/I probe 300 and/or to the system controller 180 may adjust the impedance of the RF tuning circuit 144 by adjusting variable components within the RF tuning circuit 144. In at least one embodiment, the variable components may be adjusted with stepper motors or the like. In at least one embodiment, the variable components of the RF tuning circuit 144 may be or include variable capacitors. In at least one embodiment, the tuning circuits 164, 174 may include a same or similar V/I probe that senses the voltage magnitude, the current magnitude, and/or the phase in the same manner.

Based on the voltage magnitude, current magnitude, and/or phase sensed by the V/I probe 300, the system controller 180 may adjust circuit elements in the filter array 400 to create a desired effect on the plasma 105 in the chamber 110. Referring to FIG. 4, in at least one embodiment, circuit elements of the low pass filter 410, the high pass filter 430, and/or the notch filter 450 of the filter array 400 may include variable capacitors. One or more of the variable capacitors in the filter array 400 may be adjusted based on the $V_{mag}$ signal, $I_{mag}$ signal, and/or phase sensed by the V/I probe 300. For example, at least one of the variable capacitors 452, 454, 456, 458 of the notch filter 450 may be adjusted to change the Q of the notch filter 450, thereby affecting more or less of fundamental frequency of the second RF generator, its second harmonic, and/or third harmonic. In this way, the tuning circuit 144 may be adjusted to reshape plasma sheath parameters of the plasma 105 and/or affect the distribution of ion energy, and/or ion density, across the surface of the substrate 122.

The foregoing has outlined features of several embodiments so that those skilled in the art may better understand the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A matching network for physical vapor deposition, comprising:
   a first RF generator coupled to a deposition chamber target through a first impedance matching network having a first tuning circuit comprising a Voltage/Current probe, wherein the first RF generator is configured to introduce a first AC signal to the deposition chamber target; and
   a second RF generator coupled to a deposition chamber pedestal through a second impedance matching network and configured to introduce a second AC signal to the deposition chamber pedestal, wherein the first tuning circuit is configured to modify an effect of the second AC signal on plasma formed between the deposition chamber target and the deposition chamber pedestal, and wherein the Voltage/Current probe comprises:

a voltage sensor configured to sense a voltage of an AC signal through an RF rod disposed at the output of the first impedance matching network;

a Root Mean Square to DC voltage converter coupled to the voltage sensor via a low pass filter, an attenuator, and an overshoot clamp, wherein the Root Mean Square to DC voltage converter is configured to convert a filtered, attenuated, and clamped AC voltage to a DC voltage; and a buffer voltage amplifier coupled to the voltage converter via a DC scaling circuit and an offset adjustment circuit, wherein the buffer voltage amplifier is configured to output a voltage magnitude signal.

2. The matching network of claim 1, wherein the second impedance matching network includes a second tuning circuit configured to modify an effect of the first AC signal on the plasma.

3. The matching network of claim 1, wherein the Voltage/Current probe is coupled to the deposition chamber target and a filter array is coupled to the Voltage/Current probe.

4. The matching network of claim 3, wherein the Voltage/Current probe and the filter array are coupled to a system controller configured to adjust impedance in the filter array.

5. The matching network of claim 3, wherein the Voltage/Current probe further comprises:

a current sensor configured to sense a current of the AC signal;

a Root Mean Square to DC current converter coupled to the current sensor via a low pass filter, an attenuator, and an overshoot clamp, wherein the Root Mean Square to DC current converter is configured to convert a filtered, attenuated, and clamped AC current to a DC current; and a buffer current amplifier coupled to the Root Mean Square to DC current converter via a DC scaling circuit and an offset adjustment circuit, wherein the buffer current amplifier is configured to output a current magnitude signal.

6. The matching network of claim 5, further comprising a phase detection circuit coupled to at least one of the buffer voltage amplifier, the buffer current amplifier, or both, wherein the phase detection circuit is configured to output a phase of the AC signal.

7. The matching network of claim 3, wherein the filter array comprises a low pass filter, a high pass filter, and a notch filter joined in parallel and each having an adjustable impedance.

8. The matching network of claim 7, wherein the low pass filter comprises two or more cascaded Inductor-Capacitor sections, each Inductor-Capacitor section comprising an inductor connected in series with a variable capacitor;

wherein the high pass filter comprises two or more cascaded Inductor-Capacitor sections, each Inductor-Capacitor section comprising a variable capacitor connected in series with an inductor; and wherein the notch filter comprises two or more cascaded shunt m-derived half sections, each m-derived shunt half section comprising a series impedance provided by an inductor in parallel with a variable capacitor and a shunt admittance provided by a fixed capacitor.

9. A method for controlling physical vapor deposition, comprising:

introducing a first AC signal to a target of a physical vapor deposition chamber through a first impedance matching network having a first tuning circuit;

introducing a second AC signal to a pedestal disposed in the chamber through a second impedance matching network to bias the pedestal;

introducing a gas into the chamber to facilitate formation of a plasma between the target and the pedestal;

with the first tuning circuit, modifying an effect of a fundamental frequency of the second AC signal on the plasma, thereby adjusting a plasma sheath to facilitate ionization trajectory control;

measuring an AC voltage of the second AC signal;

filtering and attenuating the AC voltage;

converting the filtered and attenuated AC voltage to a DC voltage; and scaling, offsetting, and buffering the DC voltage to determine a voltage magnitude of the second AC signal.

10. The method of claim 9, further comprising modifying an effect of second and third harmonics of the second AC signal on the plasma with the first tuning circuit.

11. The method of claim 9, wherein modifying the effect of the fundamental frequency of the second AC signal comprises adjusting an impedance of the first tuning circuit by adjusting a capacitance of a variable capacitor therein.

12. The method of claim 11, wherein the variable capacitor is manually adjusted.

13. The method of claim 11, wherein the variable capacitor is adjusted with a motor linked to a system controller.

14. The method of claim 13, further comprising referencing a look-up table to determine a desired impedance of the first tuning circuit, wherein the capacitance of the variable capacitor is modified via the motor to match values from the look up table.

15. The method of claim 13, further comprising determining the voltage magnitude, a current magnitude, and a phase of the second AC signal in the chamber using a Voltage/Current probe coupled to the system controller, wherein the capacitance of the variable capacitor is modified via the motor based on the determined voltage magnitude, current magnitude, and phase.

16. The method of claim 9, further comprising modifying an effect of the first AC signal on the plasma with a second tuning circuit disposed in the second impedance matching network.

17. The method of claim 9, further comprising introducing a DC voltage to the target of the chamber.

18. A method for controlling physical vapor deposition, comprising:

introducing a first AC signal to a target of a chamber of a physical vapor deposition system through a first impedance matching network having a tuning circuit;

introducing a second AC signal to a pedestal disposed in the chamber to bias the pedestal;

introducing a gas into the chamber to facilitate formation of a plasma between the target and the pedestal;

with the tuning circuit, modifying an effect of the second AC signal on the plasma, thereby adjusting a plasma sheath to facilitate ionization trajectory control; and auto-tuning the tuning circuit comprising:

determining a voltage magnitude and a current magnitude of the second AC signal, wherein determining the voltage magnitude comprises, measuring an AC voltage of the second AC signal, filtering and attenuating the AC voltage, converting the filtered and attenuated AC voltage to a DC voltage, and scaling, offsetting, and buffering the DC voltage to determine the voltage magnitude; and modifying an impedance of a variable filter component of the tuning circuit to further adjust the plasma sheath based on the determined voltage magnitude and current magnitude.

19. The method of claim 18, wherein determining the current magnitude comprises:

measuring an AC current of the second AC signal;

filtering and attenuating the AC current;

converting the filtered and attenuated AC current to a DC current; and scaling, offsetting, and buffering the DC current to determine the current magnitude.

20. The method of claim 18, wherein auto-tuning the tuning circuit further comprises determining a phase of the second AC signal from the determined voltage magnitude and current magnitude.

* * * * *